United States Patent
Fitz et al.

(10) Patent No.: US 12,136,847 B2
(45) Date of Patent: Nov. 5, 2024

(54) CENTRAL UNIT FOR SUPPLYING EMERGENCY LIGHTING MEANS ON A DC BUS

(71) Applicant: ZUMTOBEL LIGHTING GMBH, Dornbirn (AT)

(72) Inventors: Thomas Fitz, Göfis (AT); Christoph Stadler, Mäder (AT)

(73) Assignee: Zumtobel Lighting GmbH, Dornbirn (AT)

(*) Notice: Subject to any disclaimer, the term of this patent is extended or adjusted under 35 U.S.C. 154(b) by 212 days.

(21) Appl. No.: 17/777,343

(22) PCT Filed: Dec. 16, 2020

(86) PCT No.: PCT/EP2020/086567
§ 371 (c)(1),
(2) Date: May 17, 2022

(87) PCT Pub. No.: WO2021/130089
PCT Pub. Date: Jul. 1, 2021

(65) Prior Publication Data
US 2022/0407347 A1     Dec. 22, 2022

(30) Foreign Application Priority Data
Dec. 23, 2019 (EP) .................... 19219187

(51) Int. Cl.
*H02J 9/06* (2006.01)
*G01R 19/165* (2006.01)
(Continued)

(52) U.S. Cl.
CPC .......... *H02J 9/061* (2013.01); *G01R 19/1659* (2013.01); *H02J 7/0029* (2013.01);
(Continued)

(58) Field of Classification Search
CPC ........ H02J 9/061; H02J 7/0029; H02J 7/0068; H02J 7/02; H02J 2207/20; G01R 19/1659
(Continued)

(56) References Cited

U.S. PATENT DOCUMENTS 5,466,974 A * 11/1995 Sutrina ............... H02B 1/20
307/38
2012/0104858 A1 * 5/2012 Noe ..................... H05B 47/20
307/66
(Continued)

FOREIGN PATENT DOCUMENTS

DE     29823943 U1    7/2000
DE     19807844 C2    9/2001
(Continued)

OTHER PUBLICATIONS

PCT/EP2020/086567, International Search Report and Written Opinion dated Feb. 26, 2021, 13 pages.
(Continued)

*Primary Examiner* — Michael R. Fin
(74) *Attorney, Agent, or Firm* — Andrus Intellectual Property Law, LLP

(57) ABSTRACT

The invention relates to a central unit (100) for supplying emergency lighting means (101a, 101b) on a DC bus (101), comprising an AC input (103) for receiving an AC supply signal, an AC/DC converter (104) configured to convert the AC supply signal into a DC supply signal, an electrical energy storage (105), in particular a battery, configured to be charged by the DC supply signal, wherein the electrical energy storage (105) is configured to supply electrical power in an emergency situation, and a DC/DC converter (107) configured to convert a DC output signal of the electrical energy storage (105) into a DC bus voltage and to forward the DC bus voltage to the lighting means (101a, 101b) on the DC bus (101) via an output circuit (109), wherein the output
(Continued)

circuit (109) is arranged on a modular card (111), and wherein the modular card (111) is detachably connectable to a base body (102) of the central unit (100).

14 Claims, 6 Drawing Sheets

(51) Int. Cl.
  *H02J 7/00* (2006.01)
  *H02J 7/02* (2016.01)
(52) U.S. Cl.
  CPC .............. *H02J 7/0068* (2013.01); *H02J 7/02* (2013.01); *H02J 2207/20* (2020.01)
(58) Field of Classification Search
  USPC ........................................................ 307/23
  See application file for complete search history.

(56) References Cited

U.S. PATENT DOCUMENTS

| | | | | |
|---|---|---|---|---|
| 2013/0147367 A1* | 6/2013 | Cowburn | ............... | H05B 47/18 315/210 |
| 2017/0317510 A1* | 11/2017 | Banerjee | ................. | H02J 9/061 |
| 2018/0316215 A1 | 11/2018 | Lu et al. | | |
| 2019/0267833 A1* | 8/2019 | Collins | ................... | H02J 9/061 |
| 2020/0103445 A1* | 4/2020 | Medina Garcia | ...... | G01R 31/58 |

FOREIGN PATENT DOCUMENTS

| | | |
|---|---|---|
| EP | 1555860 A1 | 7/2005 |
| EP | 1835793 A2 | 9/2007 |
| WO | 2010139080 A1 | 12/2010 |

OTHER PUBLICATIONS

EP 19219187.2 Notice of Opposition dated Jan. 24, 2024, 30 pages and English Machine Translation, 30 pages.
licht.wissen 10 Brochure, Notbeleuchtung, Sicherheitsbeleuchtung, www.licht.de, Fordergemeinschaft Gutes Licht, Lyoner Strasse 9, 60528 Frankfurt am Main, Germany, 52 pages.
DIN EN 50171, 23 pages.
"DC-Lighting", ZVEI: Die Elektroindustrie, Jul. 2019, 24 pages.
Inotech Invoice Nr. 1294418, daed Mar. 1, 2017.
"Emergency Lighting Device Mounting and Operating Instructions" Inotech Sicherheitstechnik GmbH, Am Buschgarten 17, D-59469 Ense, Apr. 2017, 76 pages.
CLS Fusion, 24V Gerate und Leuchten, inotec Sicherheitstechnik GmbH, Am Buschgarten 17, D-59469 Ense, Apr. 2017, 192 pages.
Eidesstattliche Versicherung, dated Jan. 10, 2024, 3 pages.

* cited by examiner

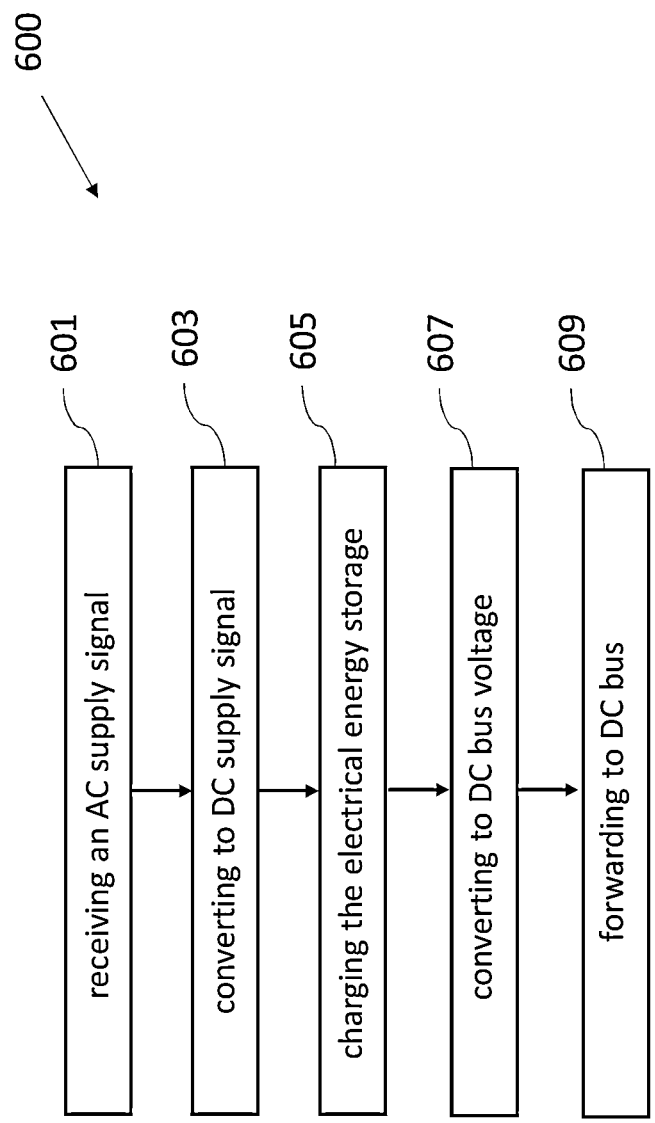

CENTRAL UNIT FOR SUPPLYING EMERGENCY LIGHTING MEANS ON A DC BUS

CROSS-REFERENCE TO RELATED APPLICATION

The present application is the U.S. national stage application of international application PCT/EP2020/086567 filed Dec. 15, 2020, which international application was published on Jul. 1, 2021 as International Publication WO 2021/130089 A1. The international application claims priority to European Patent Application No. 19219187.2 filed Dec. 23, 2019.

TECHNICAL FIELD OF THE INVENTION

The invention relates to a central unit for supplying emergency lighting means on a DC bus and a method for operating such a central unit. The invention further relates to an emergency lighting system.

BACKGROUND OF THE INVENTION

Emergency lighting systems enable a quick and safe evacuation of buildings in an emergency situation, for instance during a fire alarm.

The emergency lighting system can comprise a central unit with a battery, which supplies emergency luminaires and other devices, e.g. sensors, with energy via a DC-BUS. The central unit can have a printed circuit board with an output circuit that is connected to the DC bus. The circuit board is typically integrated in the central unit.

However, the replacement of components on such an integrated circuit board in case of a failure can be difficult. Typically, the entire circuit board needs to be removed from the central unit, which is laborious and time-consuming because the board is mechanically fixed to the central unit, surrounded by an enclosure and connected via several electrical connections.

Furthermore, the electronic components on the board are often sensitive to ESD, which makes it difficult to remove individual components from the circuit board without causing damage.

It is known to install the output circuit in external output units that are separate from the central unit. However, these units are relatively cost-intensive because they have a separate housing and several connectors for connecting emergency luminaires. In order to replace a circuit board from such an external output unit, the luminaires have to be disconnected and several screws have to be removed, which is also laborious and time-consuming.

Thus, it is an objective to provide an improved central unit for supplying emergency lighting means on a DC bus, an improved emergency lighting system and an improved method for operating a central unit for suppling emergency lighting means on a DC bus, which avoid the above-mentioned disadvantages. In particular, it is an object to provide a central unit with an output circuit that can be easily replaced by a user without a tool.

SUMMARY OF THE INVENTION

The object of the present invention is achieved by the solution provided in the enclosed independent claims. Advantageous implementations of the present invention are further defined in the dependent claims.

According to a first aspect, the invention relates to a central unit for supplying emergency lighting means on a DC bus, comprising an AC input for receiving an AC supply signal, an AC/DC converter configured to convert the AC supply signal into a DC supply signal, an electrical energy storage, in particular a battery, configured to be charged by the DC supply signal, wherein the electrical energy storage is configured to supply electrical power in an emergency situation, and a DC/DC converter configured to convert a DC output signal of the electrical energy storage into a DC bus voltage and to forward the DC bus voltage to the lighting means on the DC bus via an output circuit, wherein the output circuit is arranged on a modular card, and wherein the modular card is detachably connectable to a base body of the central unit. This achieves the advantage that the output circuit can be easily replaced by a user, in particular without having to use a tool or opening a housing of the central unit. The output circuit is configured to receive the DC bus voltage from the DC/DC converter via a power interface of the modular card, and to forward the DC bus voltage to the DC bus.

Preferably, supplying the emergency lighting means on the DC bus refers to providing a power supply of the emergency lighting means on the DC bus, in particular providing a DC bus voltage for a voltage supply of the emergency lighting means via the DC bus.

The emergency lighting means can comprise emergency luminaires, such as emergency lights or illuminated escape signs, or other lighting technology devices, e.g. sensors. The emergency lighting means can comprise an LED track.

The AC input signal can be the AC mains. In particular, the AC input signal is a 230 V signal.

The AC/DC converter can be configured to transfer the AC input voltage into an ELV (Extra Low Voltage) signal. For instance, the DC input voltage signal generated by the AC/DC converter is below 120 V, in particular below 50 V.

The central unit can comprise a charging circuit for charging the electrical energy storage. The AC/DC converter can be a component of said charging circuit.

The DC/DC converter can be configured to convert the output signal of the electrical energy storage to a DC bus voltage of another voltage level. The DC bus voltage can be a supply voltage for supplying the emergency lighting means connected to the DC bus. In particular, the DC bus voltage is 48 V or 24 V.

The output circuit can be configured to modulate the DC bus voltage, in particular with a powerline modulation. The output circuit can be configured to filter the DC bus voltage, in particular to filter out unwanted interferences or surges from the DC bus voltage.

The modular card can comprise a printed circuit board. The output circuit can be arranged on the printed circuit board.

The AC input, the AC/DC converter and the electrical energy storage can be arranged in or on the base body of the central unit. The central unit can comprise a housing for the base body.

In an embodiment, the central unit comprises an output terminal for electrically connecting the output circuit to the DC bus, wherein the output terminal is arranged on the base body of the central unit. This provides the advantage that the DC bus does not have to be disconnected from the central unit when the modular card is replaced.

In an embodiment, the DC/DC converter is arranged on the modular card.

Alternatively, the DC/DC converter can be arranged on the base body of the central unit.

In an embodiment, the central unit comprises a control unit for controlling the output circuit, wherein the control unit is arranged in or on the base body of the central unit. This achieves the advantage that components of the output circuit can be controlled efficiently.

The central unit can comprise an input interface, in particular a DALI-interface, for receiving status information or control commands. The status information can be information on an emergency situation, e.g. a fire alarm. The control unit can be configured to control the DC bus voltage based on the status information or control commands.

In an embodiment, the modular card comprises a communication interface for exchanging communication data between the control unit and the output circuit.

The communication data can comprise control commands, measurement data, powerline modulation and/or demodulation data.

The base body of the central unit can comprise a complementary communication interface for establishing communication between the control unit and the output circuit. In particular, the communication interface is a DALI-interface.

In an embodiment, the control unit is configured to detect whether the modular card is connected to the base body of the central unit if the control unit receives communication data from the output circuit. This achieves the advantage that the central unit can detect efficiently if a modular card is plugged in.

In an embodiment, the output circuit on the modular card comprises a switch unit, wherein the switch unit comprises a switch for interrupting a current flowing through the output circuit in its open state. This achieves the advantage that a voltage or current supply can be interrupted in case of a faulty current or voltage to prevent damage to the system.

In an embodiment, the output circuit comprises a current or voltage measurement unit for measuring a current or a voltage in the output circuit. This achieves the advantage that a faulty current or voltage in the modular card can be detected.

In an embodiment, the control unit is configured to receive the current or voltage measurements from the current or voltage measurement unit, wherein the control unit is further configured to control the switch unit to open the switch if the current or voltage are outside of a reference range. This achieves the advantage that a voltage supply of the DC bus can be interrupted in case of a faulty current or voltage to prevent damage to the system.

In an embodiment, the output circuit on the modular card comprises a powerline modulation unit for modulating the DC bus voltage, an EMC filter, a surge protector and/or a fuse. This provides the advantage that the bus voltage signal can be modulated and/or filtered by the central unit.

The powerline modulation unit can be connected with the controller of the central unit, in particular via the communication interface of the modular car. The controller can be configured to control the powerline modulation unit.

The powerline modulation unit can be configured to modulate the DC bus voltage based on modulation data received from the central unit and/or to demodulate the DC bus voltage to generate demodulation data. The powerline modulation unit can be configured to transmit the demodulation data to the control unit, in particular via the communication interface.

The modular card can further comprise a powerline amplifier and/or a powerline coupling unit connected to the powerline modulation unit.

In an embodiment, the base body of the central unit comprises at least one slot for plugging in the modular card to establish the detachable connection. This allows the advantage that the modular card can be easily connected to the base body of the central unit.

The base body can comprise a plurality of slots for plugging in a plurality of modular cards, wherein each modular card is connected to emergency illumination means on a DC bus. In particular, each card can be configured to perform powerline modulation, current or voltage measurements, AC conversion and/or EMC filtering.

The modular cards can be inserted into the central unit parallel to each other.

In embodiment, the modular card can be connected to and/or disconnected from the base body of the central unit without the use of a tool.

In an embodiment, the modular card comprises a sliding contact that engages with a contact spring of the base body when the modular card is connected to the base body, in particular plugged into the base body. This achieves the advantage that an electrical connection between base body and the modular card can be established easily by plugging in the card, and without the need for a tool.

According to a second aspect, the invention relates to an emergency lighting system comprising the central unit according to the first aspect of the invention, a DC bus and at least one emergency lighting means, wherein the at least one emergency lighting means is connected to the central unit via the DC bus. This achieves the advantage that the output circuit can be easily replaced by a user, in particular without having to use a tool or opening a housing of the central unit.

According to a third aspect, the invention relates to a method for operating a central unit for supplying emergency lighting means on a DC bus, comprising the steps of: receiving an AC supply signal at an AC input of the central unit, converting the AC supply signal into a DC supply signal, charging an electrical energy storage of the central unit, in particular a battery, by the DC supply signal, wherein the electrical energy storage is configured to supply electrical power in an emergency situation, converting a DC output signal of the electrical energy storage into a DC bus voltage, and forwarding the DC bus voltage to the lighting means on the DC bus via an output circuit, wherein the output circuit is arranged on a modular card, and wherein the modular card is detachably connectable to a base body of the central unit. This achieves the advantage that the output circuit can be easily replaced by a user, in particular without having to use a tool or opening a housing of the central unit.

The method can further comprise the step of detachably connecting the modular card to the base body of the central unit, in particular before the step of forwarding the DC bus voltage to the lighting means via the output circuit.

BRIEF DESCRIPTION OF THE DRAWINGS

The invention will be explained in the followings together with the figures.

FIG. 6 shows a schematic diagram of a method for operating a central unit for supplying emergency lighting means on a DC bus according to an embodiment.

DETAILED DESCRIPTION OF THE PREFERRED EMBODIMENTS

Figure 1:
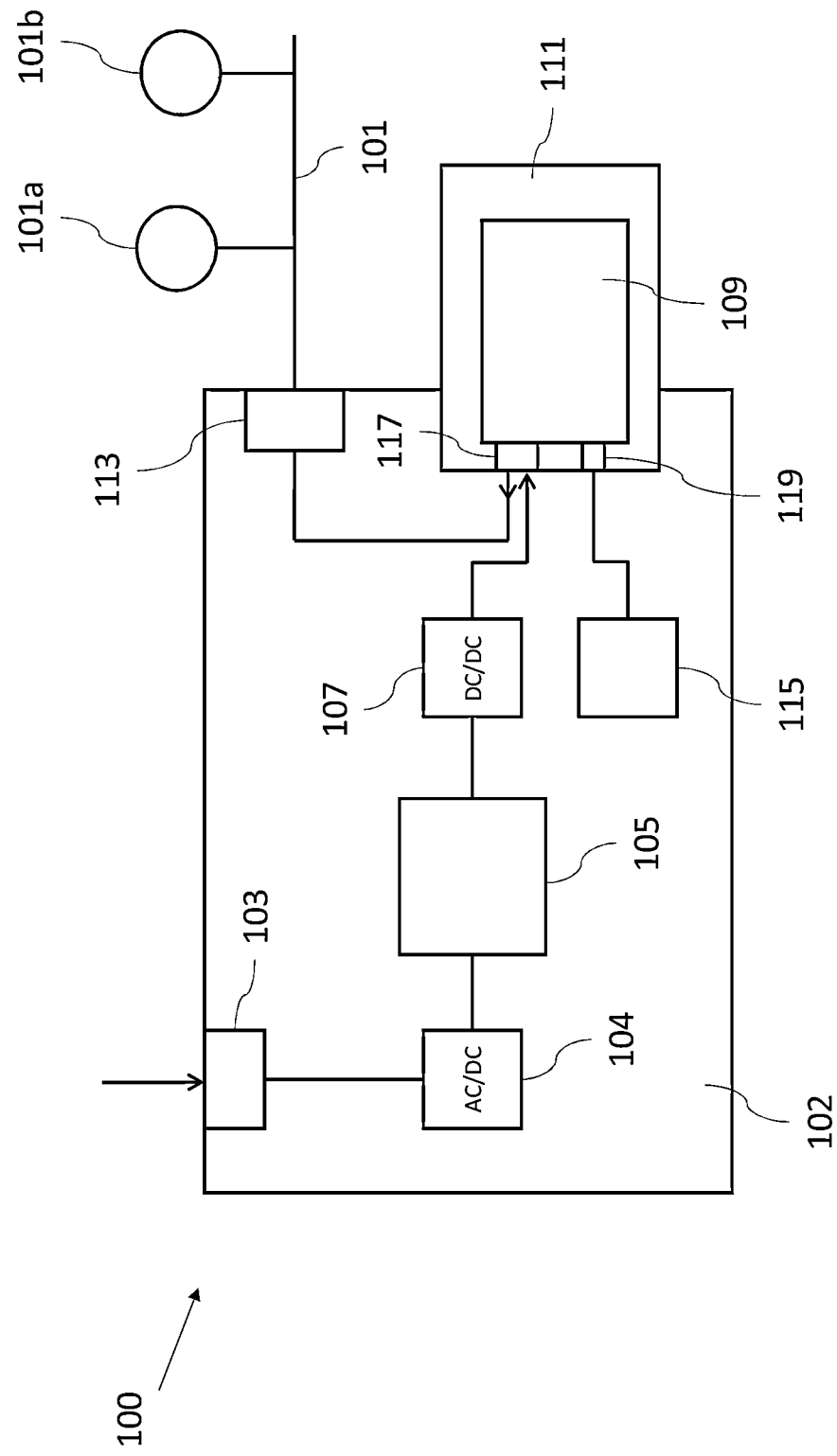
FIG. 1 shows a schematic diagram of a central unit for supplying emergency lighting means on a DC bus according to an embodiment.

The present invention is described more fully hereinafter with reference to the accompanying drawings, in which various aspects of the present invention are shown. This invention however may be embodied in many different forms and should not be construed as limited to the various aspects of the present invention presented through this disclosure. Rather, these aspects are provided so that this disclosure will be thorough and complete, and will fully convey the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus.

Various aspects of a central unit for supplying emergency lighting means on a DC bus will be presented. However, as those skilled in the art will readily appreciate, these aspects may be extended to aspects of central units or drivers for luminaires in general without departing from the invention.

The term "LED luminaire" shall mean a luminaire with a light source comprising one or more LEDs. LEDs are well-known in the art, and therefore, will only briefly be discussed to provide a complete description of the invention.

It is further understood that the aspect of the present invention might contain integrated circuits that are readily manufacturable using conventional semiconductor technologies, such as complementary metal-oxide semiconductor technology, short "CMOS". In addition, the aspects of the present invention may be implemented with other manufacturing processes for making optical as well as electrical devices. Reference will now be made in detail to implementations of the exemplary aspects as illustrated in the accompanying drawings. The same references signs will be used throughout the drawings and the following detailed descriptions to refer to the same or like parts.

FIG. 1 shows a schematic diagram of a central unit 100 for supplying emergency lighting means 101*a*, 101*b* on a DC bus 101 according to an embodiment.

The central unit 100 comprises an AC input 103 for receiving an AC supply signal, an AC/DC converter 104 configured to convert the AC supply signal into a DC supply signal, and an electrical energy storage 105, in particular a battery, configured to be charged by the DC supply signal, wherein the electrical energy storage 105 is configured to supply electrical power in an emergency situation. The central unit 100 further comprises a DC/DC converter 107 configured to convert a DC output signal of the electrical energy storage 105 into a DC bus voltage and to forward the DC bus voltage to the lighting means 101*a*, 101*b* on the DC bus 101 via an output circuit 109. The output circuit 109 is arranged on a modular card 111, wherein the modular card 111 is detachably connectable to a base body 102 of the central unit 100.

Preferably, the central unit comprises an output terminal 113 for electrically connecting the output circuit 109 to the DC bus 101, which is arranged on the base body 102 of the central unit.

If the output terminal 113 is arranged on the base body 102 and not on the modular card 111, the electrical installation remains unaffected when replacing the modular card 111. In particular, the DC bus 101 does not have to be disconnected from the output terminal 113 if the modular card 111 is replaced.

Preferably, the central unit 100 comprises a control unit 115 for communicating with the output circuit 109, in particular for controlling the output circuit 109. The control unit 115 can be arranged in or on the base body 102 of the central unit.

The control unit can comprise a processor and/or a memory. In particular, the control unit comprises a microcontroller or an ASIC.

The control unit 115 can be electrically connected to the electrical energy storage 105. The electrical energy storage 105 can provide a power supply to the control unit 115, in particular during an emergency situation.

The modular card 111 can comprise a communication interface 119 for exchanging communication data between the control unit 115 and the output circuit 109. For instance, the communication interface 119 can be a DALI-interface.

In case the modular card 111 comprises more than one output circuit 109, it can comprise separate communication interfaces 119 for each of the output circuits 109, respectively.

The base body 102 of the central unit 100 can comprise a complementary communication interface for establishing communication between the control unit 115 and the output circuit 109 if the modular card 111 is connected to the base body 102.

Preferably, the control unit 115 is configured to detect whether the modular card 111 is connected to the base body 102, in particular if the control unit 115 receives communication data from the output circuit 109.

The modular card 111 can further comprise a power interface 117. The power interface 117 can comprise a DC supply terminal for receiving the DC bus voltage from the base body 102 and a DC output terminal for retransmitting the DC bus voltage back to the base body 102, in particular after modulating and filtering the DC bus voltage by the output circuit 109.

If the modular card 111 comprises more than one output circuit 109, the power interface 117 can comprise a single DC supply terminal for supplying all output circuits 109 on the card 111, and, at the same time, separate DC output terminals (one per output circuit 109 on the card 111).

In the exemplary embodiment of FIG. 1, the DC/DC converter is arranged in the base body 102 of the central unit 100. Alternatively, the DC/DC converter can be arranged on the modular card 111, in particular, the DC/DC converter can be a component of the output circuit 109.

Moreover, the modular card 111 can comprise an additional DC/DC converter that is electrically connected do the DC/DC converter 107 in the base body 102 of the central unit 100.

The base body 102 of the central unit 100 can comprise a main board surrounded by a housing. The AC input 103, the AC/DC converter 104, the DC/DC converter 107, the control unit 115 and/or the output terminal 113 can be arranged on the main board. Furthermore, the electrical energy storage 105 can be arranged on the main board or connected to the main board.

Figure 2:
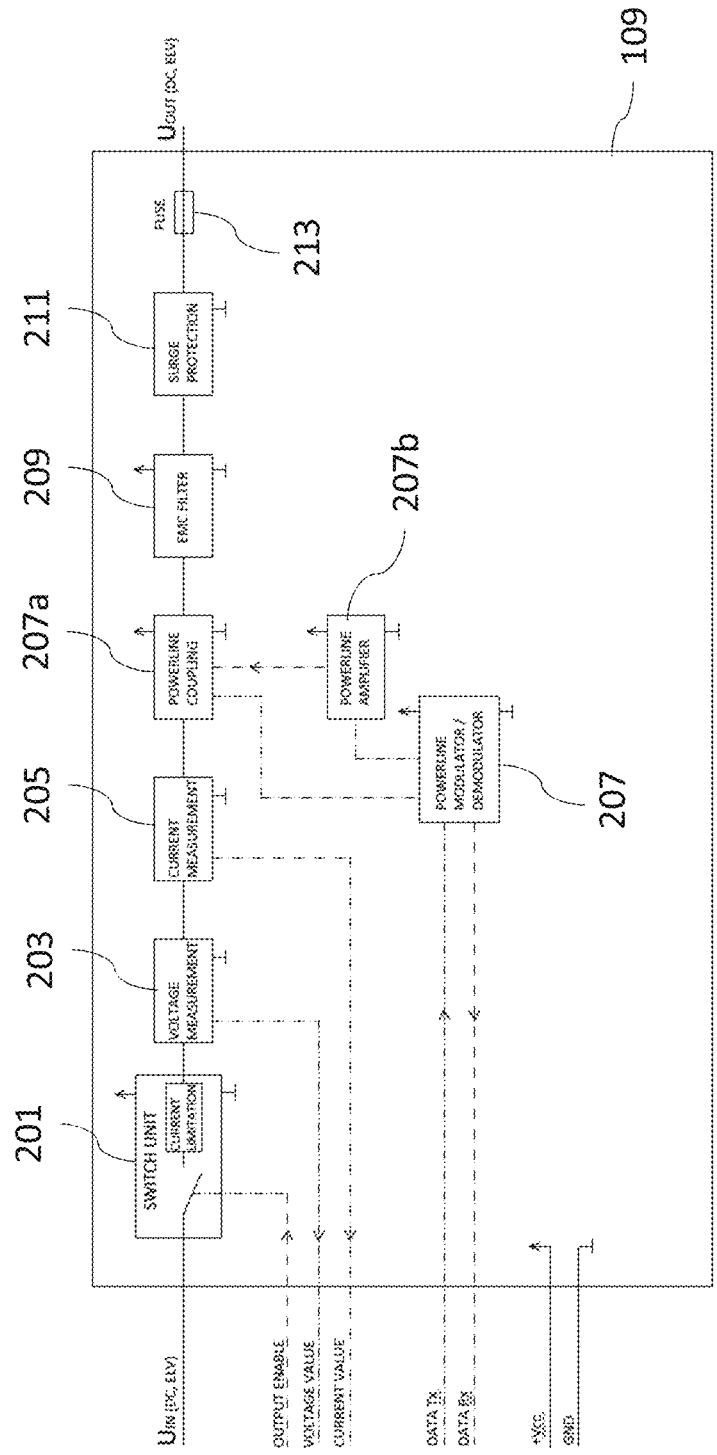
FIG. 2 shows a block diagram of an output circuit according to an embodiment.

FIG. 2 shows a block diagram of the output circuit 109 according to an embodiment.

The output circuit 109 in FIG. 2 receives the DC bus voltage as an input voltage $U_{IN(DC,ELV)}$ from the DC/DC converter via the power interface 117 of the modular card 111, and forwards the DC bus voltage, in particular after modulation and filtering, as an DC output voltage $U_{OUT(DC, ELV)}$ to the DC bus 101.

Preferably, the output circuit 109 comprises a switch unit 201. The switch unit 109 can comprise a switch, which interrupts a current flowing through the output circuit 109 in its open state.

The switch unit 201 can comprise a current limitation unit, which is configured to open the switch if the current through the output circuit 109 reaches a threshold value.

The switch unit 201 can comprise a DC switch-disconnector or a DC fault current protection switch.

Preferably, the output circuit 109 comprises a voltage measurement unit 203 and/or a current measurement unit 205 for measuring a voltage and/or a current in the output circuit 109, respectively.

The voltage measurement unit 203 and/or current measurement unit 205 can be configured to communicate their measurement results to the control unit 115, in particular via the communication interface 119 of the modular card 111.

The control unit 115 can be configured to control the switch unit 201 to open the switch if the measured currents or voltages are outside of a reference range. To open the switch, the control unit 115 can forward control commands to the switch unit 201 via the communication interface 119 of the modular card 111.

In particular, by means of the current and voltage measurement units 205, 203 the connected load on the DC bus 101 can be calculated. In case of an overload the output circuit 109 can be interrupted via the switch unit 201.

Preferably, the output circuit 109 comprises a powerline modulation and/or demodulation unit 207. The powerline modulation unit 207 can be configured to modulate the DC bus voltage with a modulation signal, or to detect a modulation on the DC bus voltage. The output circuit 109 can further comprise a powerline amplifier 207a and/or a powerline coupling unit 207b to facilitate the modulation or demodulation of the DC bus voltage.

The powerline modulation and/or demodulation unit 207 can be connected to the control unit 115 via the communication interface 119. The powerline modulation and/or demodulation unit 207 can be configured to modulate the DC bus voltage based on modulation data (DATA Tx) from the control unit 115, and/or to forward recorded demodulation data (DATA Rx) from the DC bus voltage to the control unit 115.

By modulating the DC bus voltage, individual emergency lighting means on the DC bus can be controlled and/or configured. By demodulation of the DC bus voltage, information or control commands from individual emergency lighting means or other devices on the DC bus can be forwarded to the control unit 115.

The output circuit 109 can further comprise an EMC filter 209 for filtering out electromagnetic interference from the bus voltage signal.

Furthermore, the output circuit 109 can comprise a surge protector 211 for removing voltage spikes from the bus voltage.

Preferably, the output circuit 109 comprises at least one fuse 213, in particular a DC fuse.

Figure 3:
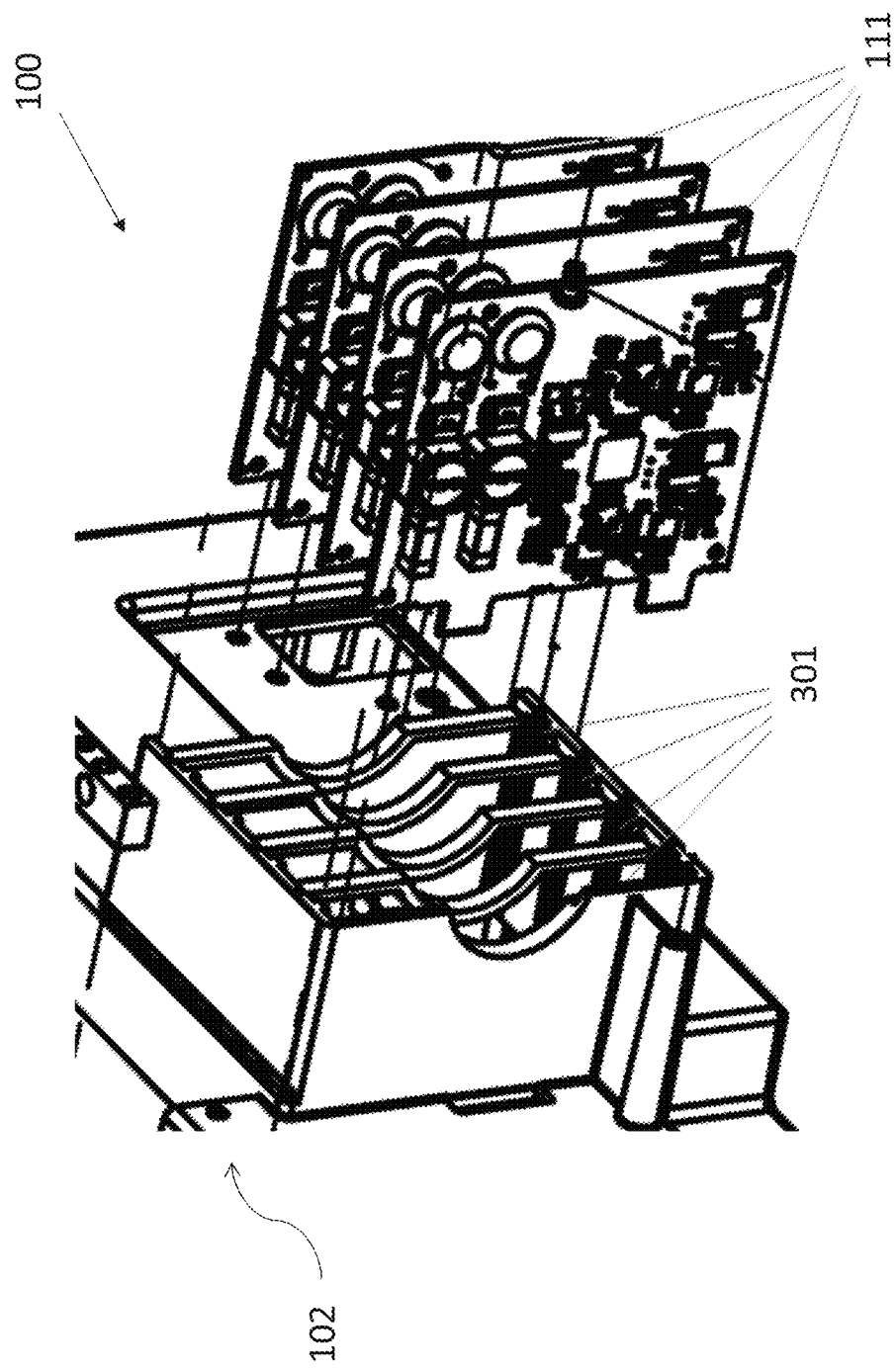
FIG. 3 shows a schematic diagram of a central unit according to an embodiment.

FIG. 3 shows a schematic diagram of the central unit 100 according to an embodiment.

The base body 102 of the central unit 100 in FIG. 3 comprises four slots 301 for connecting four modular cards 111. Each modular card 111 can be plugged in and out of a slot 301 without the use of a tool. In particular, by plugging the modular cards 111 into the slots 301, the cards 111 are fastened to the base body 102.

The modular cards 111 can comprise sliding contacts for establishing an electrical connection to the base body 102 if the card 111 is plugged in. The base body 102 can comprise complementary contact springs to contact the sliding contacts. In particular, the sliding contacts on each card 111 comprise the power interface 117 and/or the communication interface 119.

The base body 102 of the central unit 100 can comprise a cover for covering the plugged in modular cards 111. The cover can prevent the cards 111 from falling out during transport and operation of the central unit 100. The cover can further protect the cards 111 from electrostatic discharge (ESD), electric shocks and dust.

The cover can be a plastic disc inserted at the outer end of the base body 102 behind the cards 111. The cover can be opened and closed via a sliding mechanism.

Figure 4:
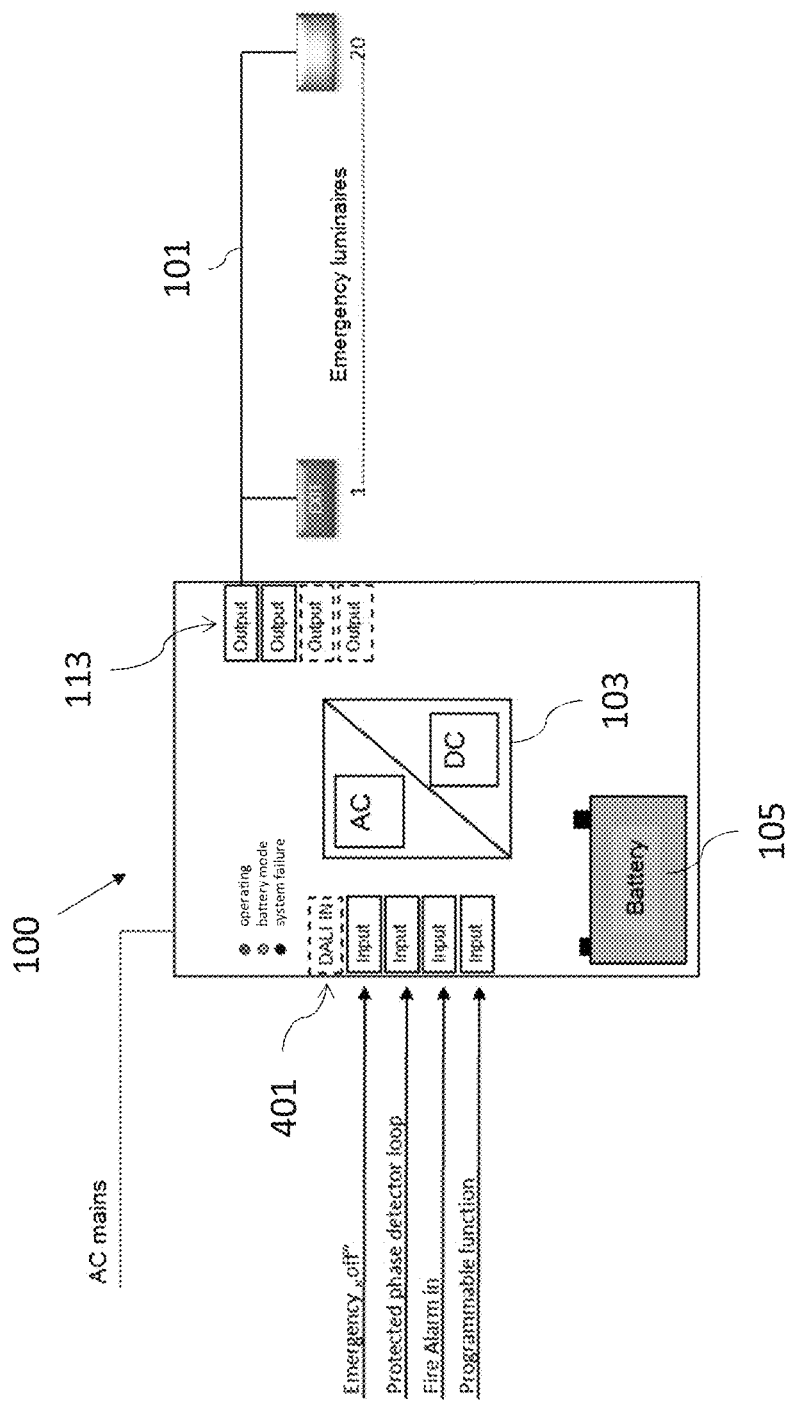
FIG. 4 shows a schematic diagram of a central unit according to an embodiment.

FIG. 4 shows a schematic diagram of the central unit 100 according to an embodiment.

The central unit 100 in FIG. 4 comprises several output terminals 113 for connecting the DC bus 101 to the central unit 100. Emergency lighting luminaires, e.g. illuminated exit or escape signs, can be supplied with the DC bus voltage via the DC bus 101.

Preferably, the central unit comprises at least one input interface 401. The input interface 401 can comprise a DALI-interface, a USB-interface, a NFC-interface or a RFID-interface.

The central unit 100 can receiving status information or control commands via the input interface 401. The status information can be information on an emergency situation, e.g. "emergency off" or "fire alarm in". The control commands can be programmable functions, in particular to program the control unit 115 and/or the emergency lighting means on the DC bus, or phase detector signals. The control unit can be configured to control the DC bus voltage based on the status information or control commands.

The central unit 100 can be connected to an external device, e.g. a smartphone, via the input interface 401. The external device can be used to transmit data to the central unit 100 or to read out a status of the central unit 100.

The central unit 100 can comprise a status light for displaying its current status. For instance, the status light displays a green light if the central unit 100 operates normally and the battery is charged from the AC mains, a yellow light if the electrical energy storage is discharged, e.g. during an emergency situation when the mains voltage is broken down, and a red light in case of a system failure.

Figure 5:
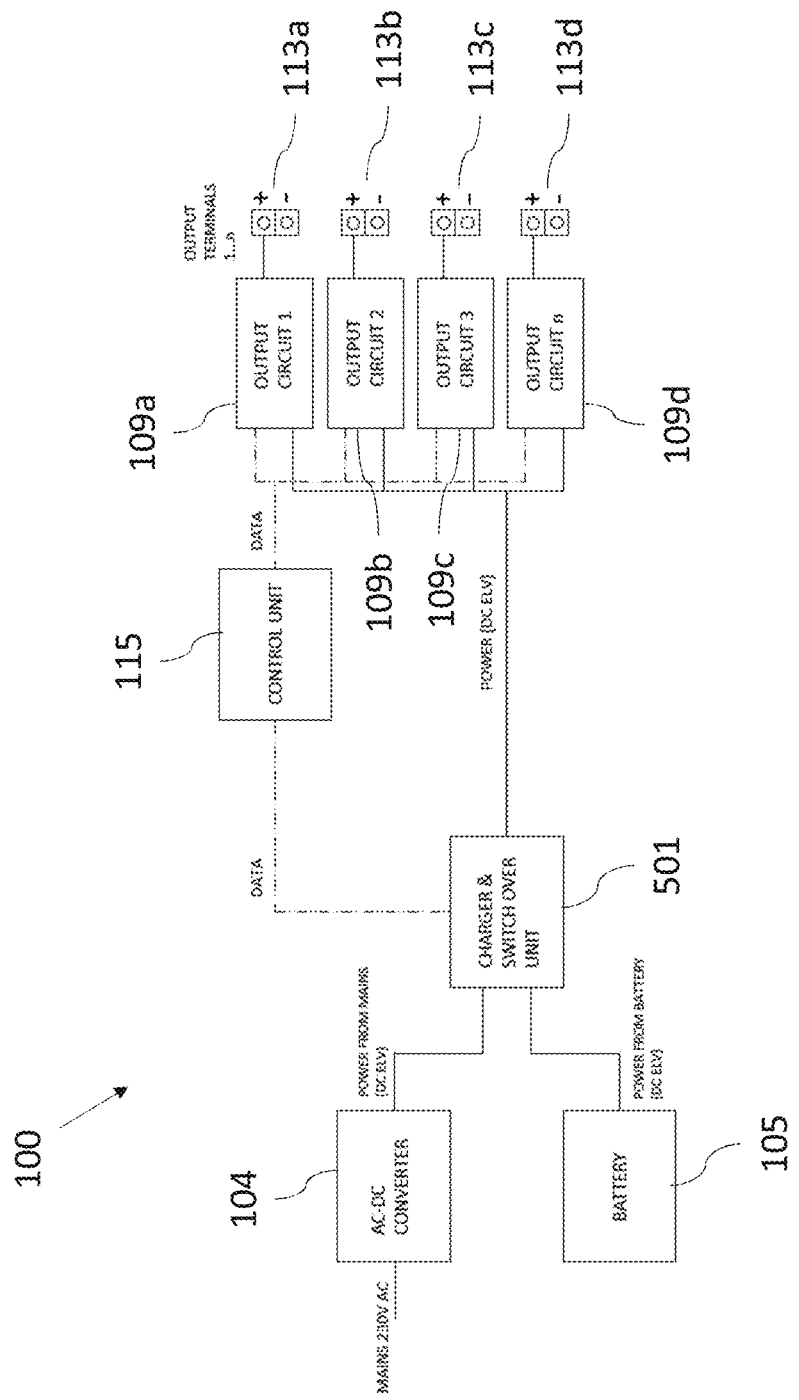
FIG. 5 shows a schematic diagram of a central unit according to an embodiment.

FIG. 5 shows a schematic diagram of the central unit 100 according to an embodiment.

The central unit 100 in FIG. 5 comprises four output circuits 109a-d, wherein each output circuit 109a-d is connected to an assigned output terminal 113a-d. Each output terminal 113a-d comprises two pins for connecting the output terminal 113a-d to the DC bus. In an embodiment, the central unit 100 comprises a charger and switchover unit 501 that is connected to the AC/DC converter 104 and to the electrical energy storage 105.

The charger and switchover unit 501 can be configured to switch the DC voltage supply of the output circuits 109a-d from the AC/DC converter 104 to the electrical energy storage 105.

In a non-emergency mode of the central unit 100 the charger and switchover unit 501 can be configured to connect the AC/DC converter 104 directly to the output circuits 109a-d and disconnect the electrical energy storage 105 from the output circuits 109*a-d*. Thus, in this mode the bus voltage is supplied to the output circuits 109*a-d* directly from the AC/DC converter 104 and not the electrical energy storage 105.

The charger and switchover unit 501 can further be configured to connect the AC/DC converter to the electrical energy storage 105 during the non-emergency mode, for charging the electrical energy storage 105.

In an emergency mode of the central unit 100, in particular in an emergency situation in which the mains voltage fails, the charger & switchover unit 501 can be configured to disconnect the AC/DC converter and instead connect the electrical energy storage 105 to the output circuits 109*a-d*.

The control unit 115 can be connected to the charger & switchover unit 501 via a communication interface, and can be configured to control the charger & switchover unit 501, in particular to switch the voltage supply of the output circuits 109*a-d* between AC/DC converter and electrical energy storage 105.

FIG. 6 shows a schematic diagram of a method 600 for operating a central unit 100 for suppling emergency lighting means 101*a*, 101*b* on a DC bus 101 according to an embodiment.

The method 600 comprises the steps of: receiving 601 an AC supply signal at the AC input 103 of a central unit 100, converting 603 the AC supply signal into a DC supply signal, charging 605 an electrical energy storage 105 of the central unit 100 by the DC supply signal, wherein the electrical energy storage 105 is configured to supply electrical power in an emergency situation, converting 607 the DC output signal of the electrical energy storage 105 into a DC bus voltage, and forwarding 609 the DC bus voltage to the lighting means 101*a*, 101*b* on the DC bus 101 via an output circuit 109.

Preferably, the output circuit 109 is arranged on a modular card 111, wherein the modular card 111 is detachably connectable to a base body 102 of the central unit 100.

The method 600 can further comprise the step of detachably connecting the modular card 111 to the base body 102 of the central unit 100, in particular before the step of forwarding 609 the DC bus voltage to the lighting means 101*a*, 101*b* on the DC bus 101 via the output circuit 109.

In particular, the method 600 can be carried out by the central units 100 of FIGS. 1, 3, 4 and/or 5.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit of scope of the invention. Thus, the breadth and scope of the present invention should not be limited by any of the above-described embodiments. Rather, the scope of the invention should be defined in accordance with the following claims and their equivalence.

Although the invention has been illustrated and described with respect to one or more implementations, equivalent alternations and modifications will occur to those skilled in the art upon the reading of the understanding of the specification and the annexed drawings. In addition, while a particular feature of the invention may have been disclosed with respect to only of the several implementations, such features may be combined with one or more other features of the other implementations as may be desired and advantage for any given or particular application.

The invention claimed is:

1. A system comprising a central unit (100) and an output circuit (109) on a detachable, modular card (111), wherein a DC bus (101) connected to an output terminal (113) on the central unit (100) is able to supply DC bus voltage to at least one emergency lighting means (101*a*, 101*b*) is connected to the DC bus (101), wherein the central unit (100) comprises:
    a base body (102) having an output terminal (113) and a slot that receives the detachable modular card,
    an AC input (103) for receiving an AC supply signal,
    an AC/DC converter (104) configured to convert the AC supply signal into a DC supply signal,
    an electrical energy storage (105), in particular a battery, configured to be charged by the DC supply signal, wherein the electrical energy storage (105) is configured to supply electrical power in an emergency situation,
    a control unit (115) for the output circuit (109) arranged in the base body (102) of the central unit (100), and
    a DC/DC converter (107) configured to convert a DC output signal of the electrical energy storage (105) into a DC bus voltage and to forward the DC bus voltage to the lighting means (101*a*, 101*b*) on the DC bus (101) via the output circuit (109); and further
    wherein the output circuit (109) is arranged on a modular card (111
    that is detachably connectable to the base body (102) of the central unit (100), and
    the output circuit (109) on the modular card (111) comprises a power interface (117) configured to receive the DC bus voltage from the DC/DC converter (107) and to forward processed DC bus voltage to the output terminal (113) on the central unit (100) connected to the DC bus (101); and a communication interface (119) that exchanges communication data between the control unit (115) and the output circuit (109) on the modular card (111);
    wherein the DC bus (101) is able to remain connected to output terminal (113) on the central unit (100) even when the modular card (111) is removed and detached from base body (102).

2. The system of claim 1, wherein another DC/DC converter (107) is arranged on the modular card (111).

3. The system of claim 1, wherein the control unit (115) is configured to detect whether the modular card (111) is connected to the base body (102) of the central unit (100) if the control unit (115) receives communication data from the output circuit (109).

4. The system of claim 1, wherein the output circuit (109) on the modular card (111) comprises:
    a switch unit (201) comprising a switch for interrupting a current flowing through the output circuit (109) in its open state; and
    a current or voltage measurement unit (205, 203) for measuring a current or a voltage in the output circuit (109);
    wherein the control unit (115) is configured to receive the current or voltage measurements from the current or voltage measurement unit (205, 203), and wherein the control unit (115) is further configured to control the switch unit (201) to open the switch if the current or voltage are outside of a reference range.

5. The system of claim 1, wherein the output circuit (109) on the modular card (111) comprises a powerline modulation unit (207) for modulating the DC bus voltage.

6. The system of claim 1, wherein the output circuit (109) on the modular card (111) comprises an EMC filter (209) for filtering out electromagnetic interference from the DC bus signal.

7. The system of claim 1, wherein the modular card (111) can be connected to and/or disconnected from the base body (102) of the central unit (100) without the use of a tool.

8. The system of claim 1, wherein the modular card (111) comprises and a cover for the at least one slot and a sliding contact that engages electrically with the base body (102) when the modular card (111) is connected to the base body (102), in particular plugged into the base body (102).

9. A method (600) for operating a central unit for supplying emergency lighting means (101a, 101b) on a DC bus (101), comprising the steps of:
   providing a central unit (100) having a base body and an output terminal for connecting to a DC bus, and an output circuit on modular card that is detachably received in a slot in the base body:
   receiving (601) an AC supply signal at an AC input of the central unit (100),
   converting (603) the AC supply signal into a DC supply signal,
   charging (605) an electrical energy storage (105) of the central unit (100), in particular a battery, by the DC supply signal, wherein the electrical energy storage (105) is configured to supply electrical power in an emergency situation,
   converting (607) a DC output signal of the electrical energy storage (105) into a DC bus voltage, and
   forwarding (609) the DC bus voltage to the lighting means (101a, 101b) on the DC bus (101) via an output circuit (109),
   wherein the output circuit (109) is arranged on a modular card (111),
   wherein the modular card (111) is detachably connectable to a base body (102) of the central unit (100), and
   wherein the output circuit (109) is configured to receive the DC bus voltage from the DC/DC converter (107) via a power interface of the modular card (111), and to forward the DC bus voltage to the DC bus (101);
   sensing a current or a voltage in the output circuit (109) on the modular card; and
   using a communications interface on the modular card to exchange data between the output circuit and a control unit in the base body, wherein the control unit instructs a switch in the output circuit to open if a sensed voltage or current in the output circuit are outside a reference range.

10. A system comprising a central unit (100) and an output circuit (109) on a detachable, modular card (111), wherein a DC bus (101) connected to an output terminal (113) on the central unit (100) is able to supply DC bus voltage to at least one emergency lighting means (101a, 101b) is connected to the DC bus (101), wherein the central unit (100) comprises:

a base body (102) having a housing, at least one slot that receives the detachable modular card,
an AC input (103) for receiving an AC supply signal,
an AC/DC converter (104) configured to convert the AC supply signal into a DC supply signal,
an electrical energy storage (105), in particular a battery, configured to be charged by the DC supply signal, wherein the electrical energy storage (105) is configured to supply electrical power in an emergency situation,
a control unit (115) for the output circuit (109) arranged in the base body (102) of the central unit (100), and
wherein the output circuit (109) is arranged on a modular card (111) that is detachably connectable to the base body (102) of the central unit (100), and the output circuit (109) on the modular card (111) comprises: a power interface (119) that receives the DC electrical power from the electrical energy storage (105) and forwards a DC bus voltage to the output terminal (113) on the base body; a DC/DC converter (107) configured to convert the DC electrical power from the electrical energy storage (105) into a DC bus voltage; and a communication interface (119) that exchanges communication data between the control unit (115) and the output circuit (109) on the modular card (111);
wherein the DC bus (101) is able to remain connected to output terminal (113) on the central unit (100) even when the modular card (111) is removed and detached from base body (102).

11. The emergency lighting system of claim 5, wherein the powerline modulator in the output circuit is capable of modulating and demodulating, and the output circuit includes a powerline amplifier (207a) and a powerline coupling unit (207b) to facilitate modulation and demodulation of the DC bus voltage, wherein the modulation unit 207 is connected to the control unit 115 via the communication interface and the modulation unit (207) is configured to modulate the DC bus voltage based on modulation data (Data Tx) from the control unit and forward demodulated data (Data Rx) from the DC bus voltage to the control unit 115.

12. The emergency lighting system of claim 1, wherein the central unit 100 includes multiple output terminals 113 and the base body includes multiple slots for multiple modular cards each with its own output circuit.

13. The emergency lighting system of claim 1, wherein the central unit 100 includes at least one data input interface (401).

14. The emergency lighting system of claim 1, wherein the control unit on the central unit provides low level voltage through the communications interface to the output circuit on the modular card.

* * * * *